US 6,504,749 B2

(12) United States Patent
Jeon

(10) Patent No.: US 6,504,749 B2
(45) Date of Patent: Jan. 7, 2003

(54) FERROELECTRIC MEMORY DEVICES WITH MEMORY CELLS IN A ROW CONNECTED TO DIFFERENT PLATE LINES

(75) Inventor: Byung-Gil Jeon, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/005,445

(22) Filed: Dec. 3, 2001

(65) Prior Publication Data
US 2002/0089871 A1 Jul. 11, 2002

(30) Foreign Application Priority Data
Jan. 8, 2001 (KR) ................................................ 01-944

(51) Int. Cl.[7] .............................................. G11C 11/22
(52) U.S. Cl. .......................................... 365/145; 365/65
(58) Field of Search ........................... 365/145, 65, 149, 365/117

(56) References Cited

U.S. PATENT DOCUMENTS 5,844,832 A * 12/1998 Kim ............................ 365/145
6,097,622 A    8/2000 Shimizu et al.
6,288,931 B1 * 9/2001 Kye et al. ................... 365/145
6,363,003 B1   3/2002 Miyamoto

FOREIGN PATENT DOCUMENTS

| JP | 10-162587 | 6/1998 |
| JP | 2001-135077 | 5/2001 |

* cited by examiner

Primary Examiner—David Lam
(74) Attorney, Agent, or Firm—Myers Bigel Sibley & Sajovec

(57) ABSTRACT

A ferroelectric memory device comprises a plurality of parallel word lines extending along a first direction, a plurality of parallel bit lines extending along a second direction transverse to the first direction, and a plurality of parallel plate lines extending along the first direction. A plurality of memory cells is arranged in rows and columns along the respective first and second directions, each of the memory cells including a transistor coupled to one of the word lines and to one of the bit lines and a ferroelectric capacitor connected to the transistor and to one of the plate lines such cells in respective rows are connected to respective word lines and that the ferroelectric capacitors of first and second subsets of a row of memory cells are connected to respective first and second plate lines.

24 Claims, 9 Drawing Sheets

US 6,504,749 B2

FERROELECTRIC MEMORY DEVICES WITH MEMORY CELLS IN A ROW CONNECTED TO DIFFERENT PLATE LINES

RELATED APPLICATION

This application claims the benefit of Korean Patent Application No. 2001-000944, filed on Jan. 8, 2001, which is incorporated by reference herein in its entirety.

BACKGROUND OF THE INVENTION

The present invention generally relates to memory devices and, more particularly, to ferroelectric memory devices.

Ferroelectric random access memory (FRAM) devices typically include a storage capacitor with a dielectric including ferroelectric material, such as a compound of lead zirconate and titanate. Cell architectures used for FRAMs include those using one transistor and one capacitor (referred to as a "1TC" cell configuration) and those using two transistors and two capacitors (referred to as a "2TC" cell configuration). A 2TC architecture is described in U. S. Pat. No. 4,873,664. A 1TC architecture is described in U. S. Pat. No. 5,978, 251. FRAMs, like DRAMs, may be classified as having a shared (or open) bit line structure, as described, for example, in U. S. Pat. No. 6,137,711, or a folded bit line structure, as described, for example, in U. S. Pat. Nos. 6,151,243, and 5,880,989. In general, data is read out of a FRAM by determining a charge on the capacitor by applying a predetermined voltage pulse signal to an electrode of the capacitor.

For the purpose of manufacturing a high-integrated FRAM, it is generally desirable to connect as many capacitors to a plate line as possible. However, the number of capacitors that can be connected to a plate line is generally limited by the capacitance of the capacitors. Because the number of memory cells that can be connected to a single plate line is typically small, it is often necessary to employ a relatively large number of circuits to control the plate lines. As a result, chip size may be increased.

FIGS. 1 and 2 illustrate conventional memory cell arrangements for 1TC memory cells, for shared and folded bit line architectures, respectively. In the shared bit line architecture shown in FIG. 1, memory cell array units MC10 are arranged in a matrix. A memory cell in the array unit MC10 includes an N-channel metal oxide transistor (NMOS) N0 having a gate connected to an ith word line WLi and a channel connected between an ith bit line BLi and a capacitor CF0. Memory cells connected to the same bit line are connected to respective different plate lines PLi, PLi+1.

In the folded bit line architecture shown in FIG. 2, a two memory cell array unit MC20 is operated by adjacent bit lines BLi, BLi+1, and capacitors of the two memory cells of the array unit MC20 are respectively connected to the word lines WLi and WLi+1 and commonly connected to one plate line PLi. Such an arrangement can be more highly integrated than the open bit line architecture of FIG. 1. However, the number of the capacitors that can be connected to a single plate line is typically limited. Consequently, many circuits may be required to select the plate lines, which can increase chip size.

SUMMARY OF THE INVENTION

According to embodiments of the present invention, a ferroelectric memory device comprises a plurality of parallel word lines extending along a first direction, a plurality of parallel bit lines extending along a second direction transverse to the first direction, and a plurality of parallel plate lines extending along the first direction. A plurality of memory cells is arranged in rows and columns along the respective first and second directions, each of the memory cells including a transistor coupled to one of the word lines and to one of the bit lines and a ferroelectric capacitor connected to the transistor and to one of the plate lines such that the cells in respective rows are connected to respective word lines and the ferroelectric capacitors of first and second subsets of a row of memory cells are connected to respective first and second plate lines.

In some embodiments of the present invention, the plate lines are arranged as a plurality of pairs of adjacent plate lines such that a first pair of adjacent plate lines is separated from a second pair of adjacent plate lines by a pair of rows of memory cells. The memory cells in of a row of memory cells adjacent the first pair of adjacent plate lines may be connected to alternating ones of the first and second plate lines along the first direction. Respective columns of memory cells may be connected to respective bit lines or, alternatively, memory cells in a column of memory cells may be alternately connected to first and second bit lines along the second direction.

In further embodiments of the present invention, first and second pairs of adjacent plate lines are connected to memory cells in both rows of a pair of rows of memory cells that separate first and second pairs of adjacent plate lines. Respective columns of memory cells may be connected to respective bit lines or, alternatively, memory cells in a column of memory cells may be alternately connected to first and second bit lines along the second direction. In still other embodiments, a pair of adjacent bit lines are connected only to memory cells in first and second rows of memory cells disposed on opposite sides of the pair of bit lines.

In other embodiments of the present invention, plate lines are separated from one another by pairs of adjacent rows of memory cells. In some embodiments, a plate line may be connected only to memory cells in every other column along the first direction. Respective columns of memory cells may be connected to respective bit lines or, alternatively, memory cells in a column of memory cells may be alternately connected to first and second bit lines along the second direction.

DETAILED DESCRIPTION OF EMBODIMENTS

The present invention now will be described more filly hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
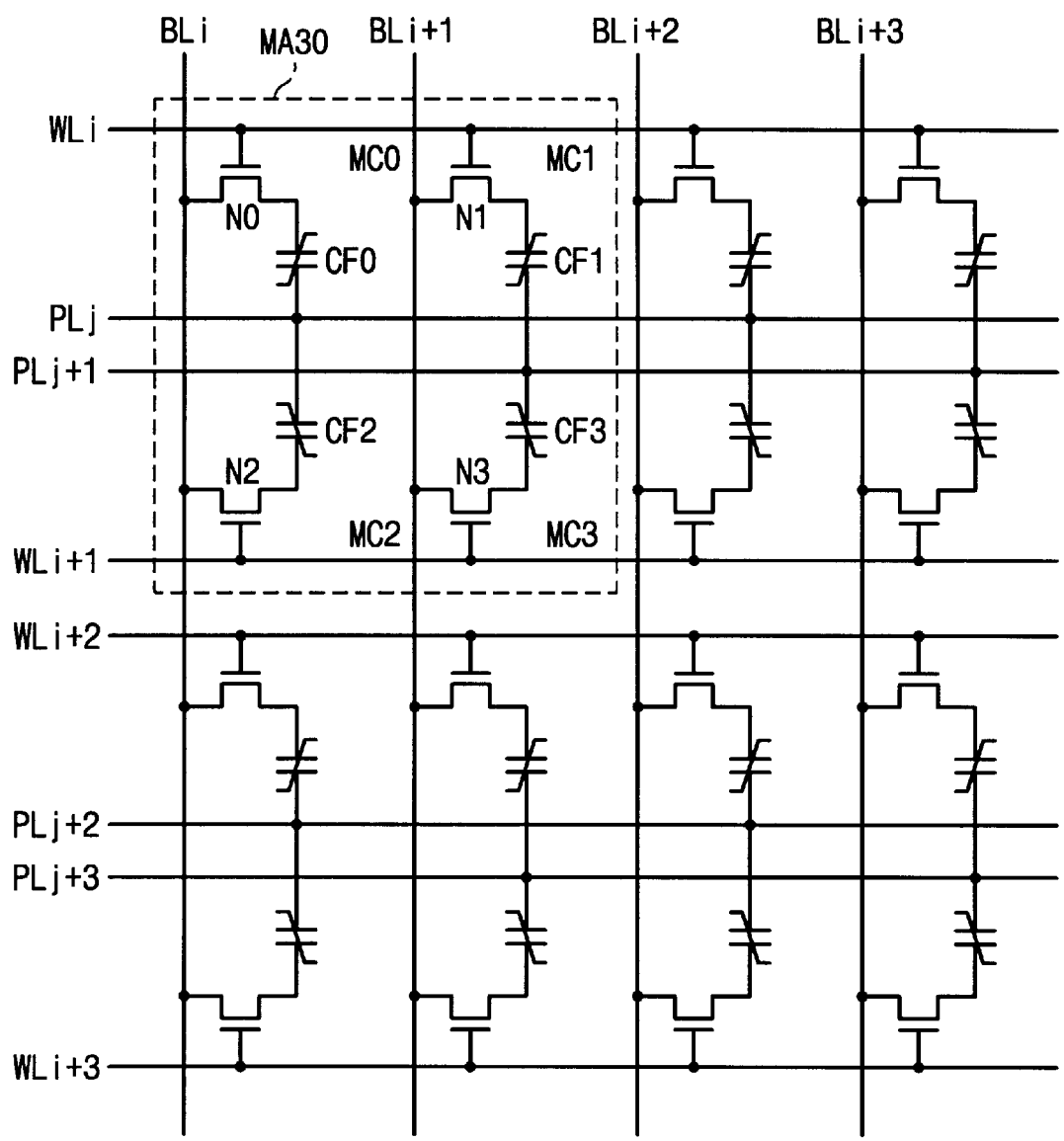
FIG. 3 is a schematic diagram of a ferroelectric memory device according to first embodiments of the present invention.

In embodiments of the present invention illustrated in FIG. 3, a memory device with a shared bit line architecture has memory cells MC0, MC1, MC2, MC3 arranged in rows and columns, with memory cells in respective columns being connected to respective bit lines BLi, BLi+1, BLi+2, BLi+3. Memory cell capacitors CF0, CF1, CF2, CF3 are connected to plate lines PLj, PLj+1 that extend in the directions of the rows, such that the memory cells in a given row are alternately connected to the plate lines PLj, PLJ+1. A pair of adjacent plate lines PLj and PLj+1 is separated from another pair of adjacent plate lines PLj+2, PLj+3 by two rows of memory cells. It will be understood that, in a shared bit line architecture, another memory cell array is connected to a reference (or complementary) set of bit lines, with a sense amplifier disposed between the sets of bit lines. The four memory cells MC0, MC1, MC2, MC3 form a repeating array unit MA30.

The memory cell MC0 includes a pass transistor N0 having a gate connected to a word line WLi and a drain connected to the bit line BLi, and capacitor CF0 connected between the pass transistor N0 and the plate line PLj. The memory cell MC1 includes a pass transistor N1 and a capacitor CF1. The pass transistor N1 has a drain connected to the bit line BLi+1 and a gate connected to the word line WLi. The capacitor CF1 is connected between the pass transistor N1 and the plate line PLj+1. The memory cell MC2 includes a pass transistor N2 having a drain connected to the bit line BLi and a gate connected to the word line WLi+1, and a capacitor CF2 connected between the pass transistor N2 and the plate line PLj. The capacitors CF0 and CF2 of the memory cells MC0 and MC2 in the column corresponding to the bit line BLi are connected to the same plate line PLj. Memory cell MC3 includes a pass transistor N3 having a drain connected to the bit line BLi+1 and a gate connected to the word line WLi+1, and a capacitor CF3 connected between the pass transistor N3 and the plate line PLj+1. The capacitors CF1 and CF3 of the memory cells MC1 and MC3 are connected to the plate line PLj+1. The array unit MA30 is arrayed in rows and columns.

To carry out a write or read operation for one memory cell, a word line, a plate line, and a bit line are typically simultaneously activated. In particular, the word lines are selectively controlled by a row decoder, and the bit lines are selected by a gate circuit which controls a connection of an input/output line (e.g., as illustrated in U. S. Pat. No. 5,917,746). Assuming that the word line WLi and the plate line PLj are activated, the memory cell MC0 is selected to carry out the write-in or read-out operation. Because the word line WLi+1 and the plate line PLj+1 in the array unit MA30 are not activated, the other memory cells MC1–MC3 are not accessed.

Figure 1:
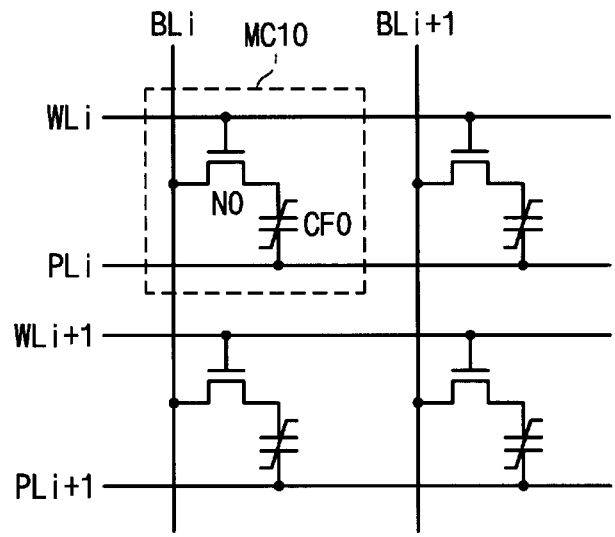
FIG. 1 is a schematic diagram of a conventional ferroelectric memory device having a shared bit line architecture.
Figure 2:
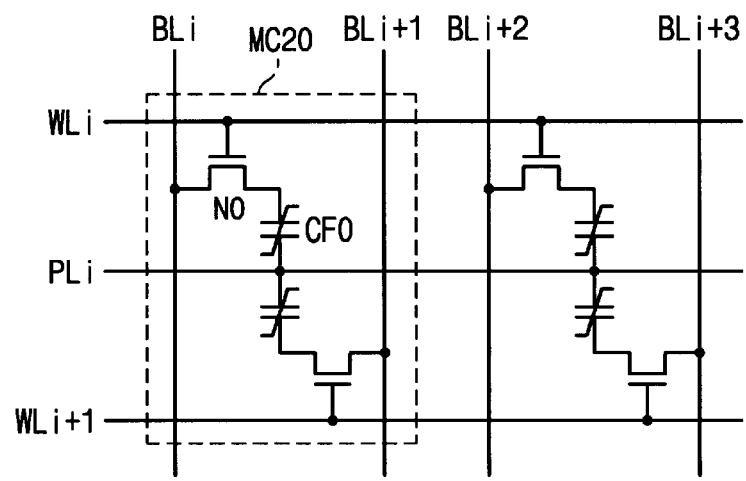
FIG. 2 is a schematic diagram of a conventional ferroelectric memory device having a folded bit line architecture.

The architecture of FIG. 3 can realize greater integration compared with the configuration shown in FIG. 1, because two capacitors are connected to one plate line in the array unit MA30. When the memory cell MC0 is selected and NMOS transistor N2 turned off, the capacitance C2 on the plate line PLj in the memory cell MC2 can be described by the following equation:

$$C2 = CF2 \times Cjn2/(CF2 + Cjn2),$$

where Cjn2 is junction capacitance between the source of transistor N2 and the capacitor CF2. The value of the junction capacitance Cjn2 is typically about 3 femtoFarads (fF) ($10^{-15}$ Farad), which may be insignificant compared with the capacitance of the capacitor CF2, which may be around 300 fF. Thus, the effect from the capacitance of the commonly connected but unselected memory cell may be insignificant.

Figure 4:
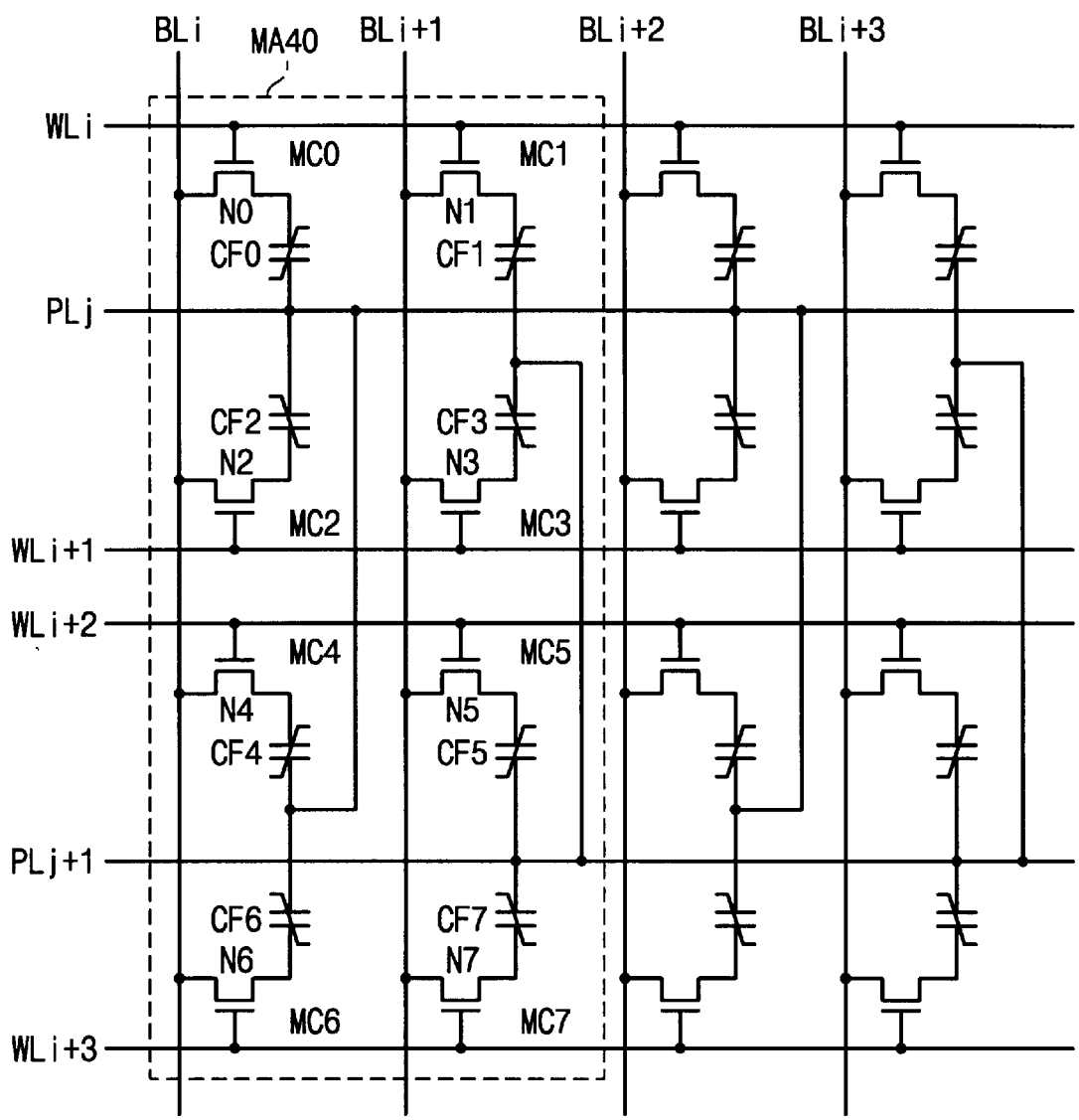
FIG. 4 is a schematic diagram of a ferroelectric memory device according to second embodiments of the present invention.

In embodiments of the present invention illustrated in FIG. 4, capacitors along a row are alternately connected to two plate lines PLj, PLj+1 that are separated by two rows of memory cells. An array unit MA40 includes eight memory cells MC0–MC7. In the memory cell MC0, a drain and a gate of an NMOS transistor N0 are respectively connected to a bit line BLi and to a word line WLi, and a capacitor CF0 is connected to the plate line PLj. A drain and a gate of an NMOS transistor N1 of the memory cell MC1 are respectively connected to a bit line BLi+1 and the word line WLi, and a capacitor CF1 is connected to the plate line PLj+1. In the memory cell MC2, a drain and a gate of an NMOS transistor N2 are respectively connected to the bit line BLi and a word line WLi+1, and a capacitor CF2 is connected to the plate line PLj. In the memory cell MC3, a drain and a gate of an NMOS transistor N3 are respectively connected to the bit line BLi+1 and the word line WLi+1, and a capacitor CF3 is connected to the plate line PLj+1.

In the memory cell MC4, a drain and a gate of an NMOS transistor N4 are respectively connected to the bit line BLi and a word line WLi+2, and a capacitor CF4 is connected to the plate line PLj. In the memory cell MC5, a drain and a gate of an NMOS transistor N5 are respectively connected to the bit line BLi+1 and the word line WLi+2, and a capacitor CF5 is connected to the plate line PLj+1. In the memory cell MC6, a drain and a gate of an NMOS transistor N6 are respectively connected to the bit line BLi and a word line WLi+3, and a capacitor CF6 is connected to the plate line PLj. In memory cell MC7, a drain and a gate of an NMOS transistor N7 are respectively connected to the bit line BLi+1 and the word line WLi+3, and a capacitor CF7 is connected to the plate line PLj+1.

When the memory cell MC0 is selected by activation of the word line WLi, the plate line PLj, and the bit line BLi, the other memory cells MC1–MC7 remain off. When four capacitors are connected to one plate line, the capacitance of the turned-off memory cells is about 3 fF, which typically is insignificant compared with the approximately 300 fF capacitance of the capacitor CF0 in the selected memory cell MC0.

Figure 5:
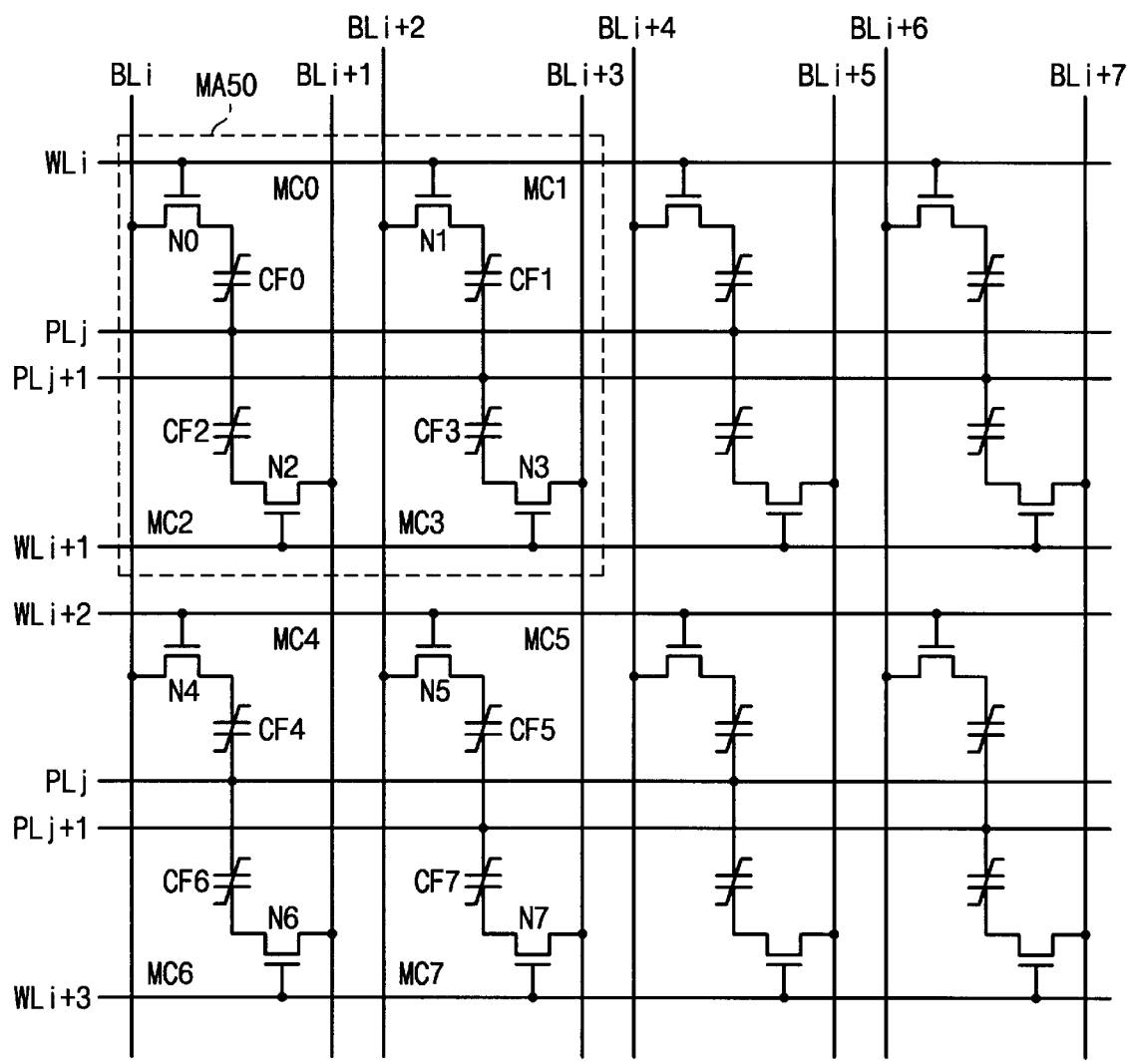
FIG. 5 is a schematic diagram of a ferroelectric memory device according to third embodiments of the present invention.

In embodiments of the present invention illustrated in FIG. 5, a plate line arrangement similar to that of FIG. 3 is used. The number of circuits for selecting the plate lines can be reduced, thereby realizing greater integration compared to the architecture shown in FIG. 4. As described above, increase of the transmission loading on the plate line scarcely affects normal operation, due to the relatively large capacitance (about 300 fF) of the capacitors. An array unit MA50 includes four memory cells MC0–MC3.

In the memory cell MC0, a drain and a gate of an NMOS transistor N0 are respectively connected to a bit line BLi and a word line WLi, and a capacitor CF0 is connected to a plate line PLj. In the memory cell MC1, a drain and a gate of an NMOS transistor N1 are respectively connected to a bit line BLi+2 and the word line WLi, and a capacitor CF1 is connected to a plate line PLj+1. In the memory cell MC2, a drain and a gate of an NMOS transistor N2 are respectively connected to a bit line BLi+1 and the word line WLi, and a capacitor CF2 is connected to the plate line PLj. In the memory cell MC3, a drain and a gate of an NMOS transistor N3 are respectively connected to a bit line BLi+3 and a word line WLi+1, and a capacitor CF3 is connected to the plate line PLj+1.

In the memory cell MC4, a drain and a gate of an NMOS transistor N4 are respectively connected to the bit line BLi and a word line WLi+2, and a capacitor CF4 is connected to the plate line PLj. In the memory cell MC5, a drain and a gate of an NMOS transistor N5 are respectively connected to a bit line BLi+2 and the word line WLi+2, and a capacitor CF5 is connected to the plate line PLj+1. In the memory cell MC6, a drain and a gate of an NMOS transistor N6 are respectively connected to the bit line Bli+1 and a word line WLi+3, and a capacitor CF6 is connected to the plate line PLj. In the memory cell MC7, a drain and a gate of an NMOS transistor N7 are respectively connected to the bit line BLi+3 and the word line WLi+3, and a capacitor CF7 is connected to the plate line PLj+1. If the word line WLi, the bit line BLi, and the plate line PLj are activated, the memory cell MC0 is selected, while the other memory cells MC1–MC3 in the array unit MA50 are unselected.

Figure 6:
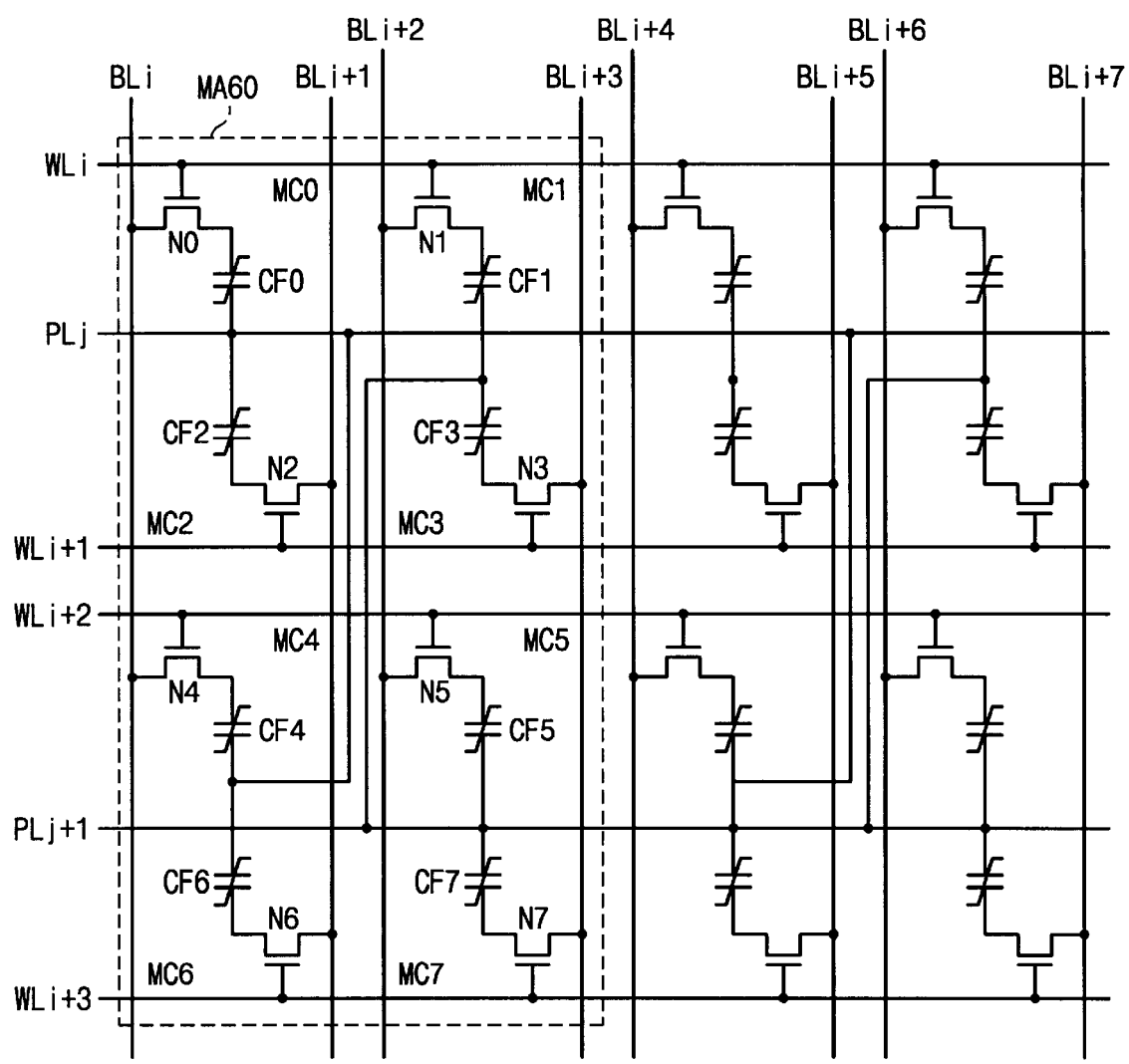
FIG. 6 is a schematic diagram of a ferroelectric memory device according to fourth embodiments of the present invention.

FIG. 6 illustrates a configuration similar to that illustrated in FIG. 4 in that plate lines PLj and PLj+1 are separated by two rows of memory cells. An array unit MA60 includes eight memory cells MC0–MC7.

In the memory cell MC0, a drain and a gate of an NMOS transistor N0 are respectively connected to a bit line BLi and a word line WLi, and a capacitor CF0 is connected to a plate line PLj. In the memory cell MC1, a drain and a gate of an NMOS transistor N1 are respectively connected to a bit line BLi+2 and the word line WLi, and a capacitor CF1 is connected to the plate line PLj+1. In the memory cell MC2, a drain and a gate of a NMOS transistor N2 are respectively connected to a bit line BLi+1 and a word line WLi+1, and a capacitor CF2 is connected to the plate line PLj. In the memory cell MC3, a drain and a gate of an NMOS transistor N3 are respectively connected to a bit line BLi+3 and the word line WLi+1, and a capacitor CF3 is connected to the plate line PLj+1. In the memory cell MC4, a drain and a gate of an NMOS transistor N4 are respectively connected to the bit line BLi and a word line WLi+2, and a capacitor CF4 is connected to the plate line PLj. In the memory cell MC5, a drain and a gate of an NMOS transistor N5 are respectively connected to the bit line BLi+2 and the word line WLi+2, and a capacitor CF5 is connected to the plate line PLj+1. In the memory cell MC6, a drain and a gate of an NMOS transistor N6 are respectively connected to the bit line BLi+1 and a word line WLi+3, and a capacitor CF6 is connected to the plate line PLj. In the memory cell MC7, a drain and a gate of an NMOS transistor N7 are respectively connected to the bit line BLi+3 and the word line WLi+3, and a capacitor CF7 is connected to the plate line PLj+1.

As four capacitors are connected to a plate line in the array unit MA60, integration can be improved. Read and write operations for the array unit MA60 are similar to those described above, i.e., when a particular word line, bit line, and plate line combination is activated, one cell connected to a plate line is selected, and the other cells connected to the plate line remain in an unselected state.

Figure 7:
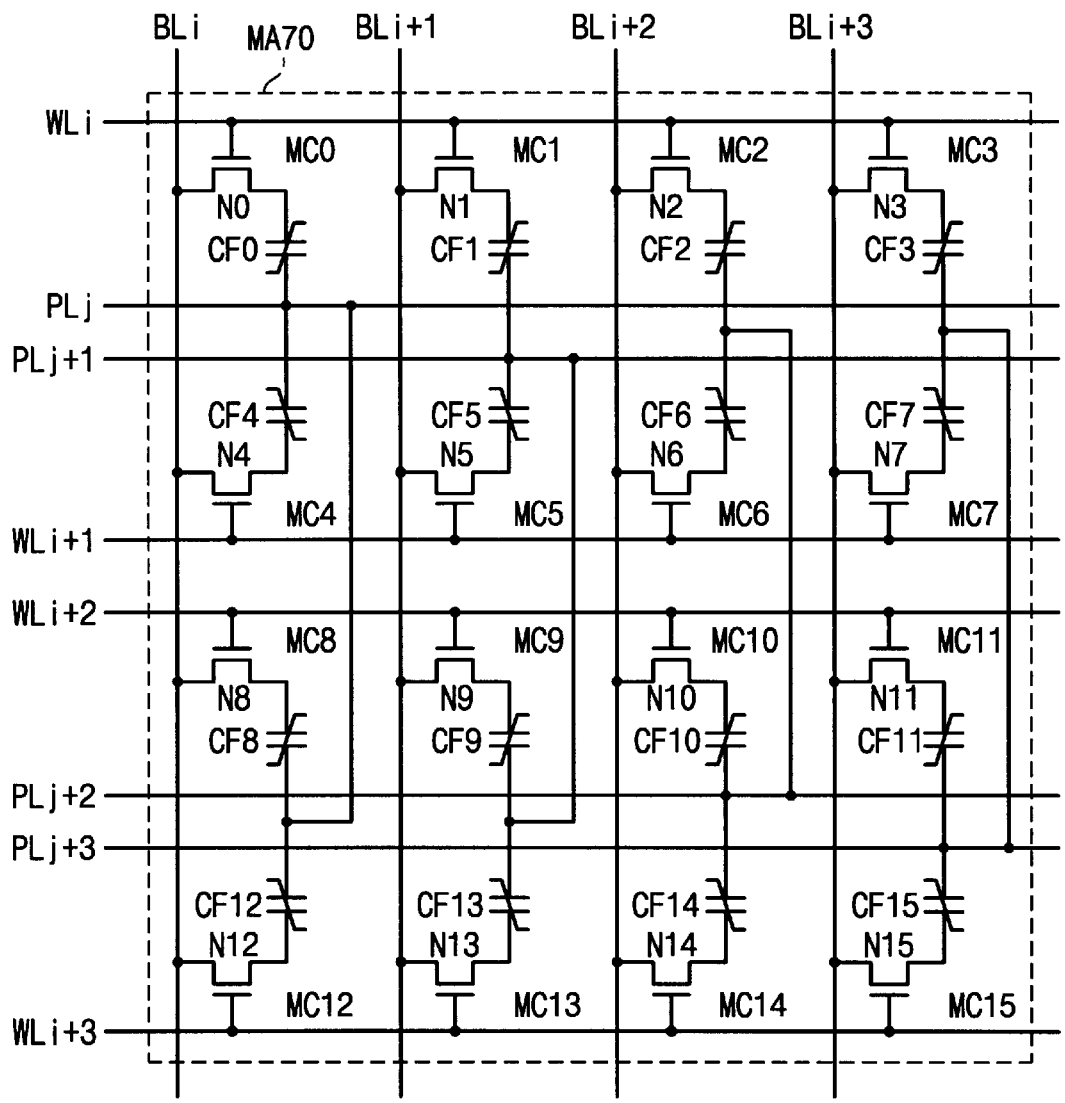
FIG. 7 is a schematic diagram of a ferroelectric memory device according to fifth embodiments of the present invention.

FIG. 7 illustrates a configuration according to other embodiments of the present invention, which includes a plate line arrangement similar to that of FIG. 3. An array unit MA70 includes 16 memory cells MC0–MC15.

In the memory cell MC0, a drain and a gate of an NMOS transistor N0 are respectively connected to a bit line BLi and a word line WLi, and a capacitor CF0 is connected to a plate line PLj. In the memory cell MC1, a drain and a gate of an NMOS transistor N1 are respectively connected to a bit line BLi+1 and the word line WLi, and a capacitor CF1 is connected to a plate line PLj+1. In the memory cell MC2, a drain and a gate of an NMOS transistor N2 are respectively connected to a line BLi+2 and the word line WLi, and a capacitor CF2 is connected to a plate line PLj+2. In the memory cell MC3, a drain and a gate of an NMOS transistor N3 are respectively connected to a bit line BLi+3 and the word line WLi, and a capacitor CF3 is connected to a plate line PLj+3. In a memory cell MC4, a drain and a gate of an NMOS transistor N4 are respectively connected to the bit line BLi and a word line WLi+1, and a capacitor CF4 is connected to the plate line PLj. In the memory cell MC5, a drain and a gate of an NMOS transistor N5 are respectively connected to the bit line BLi+1 and the word line WLi+1 and a capacitor CF5 is connected to the plate line PLj+1. In the memory cell MC6, a drain and a gate of an NMOS transistor N6 are respectively connected to the bit line BLi+2 and the word line WLi+1, and a capacitor CF6 is connected to the plate line PLj+2. In the memory cell MC7, a drain and a gate of an NMOS transistor N7 are respectively connected to the bit line BLi+3 and the word line WLi+1, and a capacitor CF7 is connected to the plate line PLj+3.

In the memory cell MC8, a drain and a gate of an NMOS transistor N8 are respectively connected to the bit line BLi and a word line WLi+2, and a capacitor CF8 is connected to the plate line PLj. In the memory cell MC9, a drain and a gate of an NMOS transistor N9 are respectively connected to the bit line BLi+1 and the word line WLi+2, and a capacitor CF9 is connected to the plate line PLj+1. In the memory cell MC10, a drain and a gate of an NMOS transistor N10 are respectively connected to the bit line BLi+2 and the word line WLi+2, and a capacitor CF10 is connected to the plate line PLj+2. In the memory cell MC11, a drain and a gate of an NMOS transistor N11 are respectively connected to the bit line BLi+3 and the word line WLi+2, and a capacitor CF11 is connected to the plate line PLj+3. In the memory cell MC 12, a drain and a gate of an NMOS transistor N1 2 are respectively connected to the bit line BLi and a word line WLi+3, and a capacitor CF12 is connected to the plate line PLj. In the memory cell MC13, a drain and a gate of an NMOS transistor N13 are respectively connected to the bit line BLi+1 and the word line WLi+3, and a capacitor CF13 is connected to the plate line PLj+1In the memory cell MC14, a drain and a gate of an NMOS transistor N14 are respectively connected to the bit line BLi+2 and the word line WLi+3, and a capacitor CF14 is connected to the plate line PLj+2. In the memory cell MC15, a drain and a gate of an NMOS transistor N15 are respectively connected to the bit line BLi+3 and the word line WLi+3, and a capacitor CF 15 is connected to the plate line PLj+3.

As four capacitors are connected to one plate line in the array unit MA70, the integration can be increased. Similar to the operations described above, when the word line WLi, the plate line PLj, and the bit line BLi are activated in a read or write operation, for example, only the memory cell MC0 is selected, while the other memory cells connected to the plate line PLj remain in an unselected state.

Figure 8:
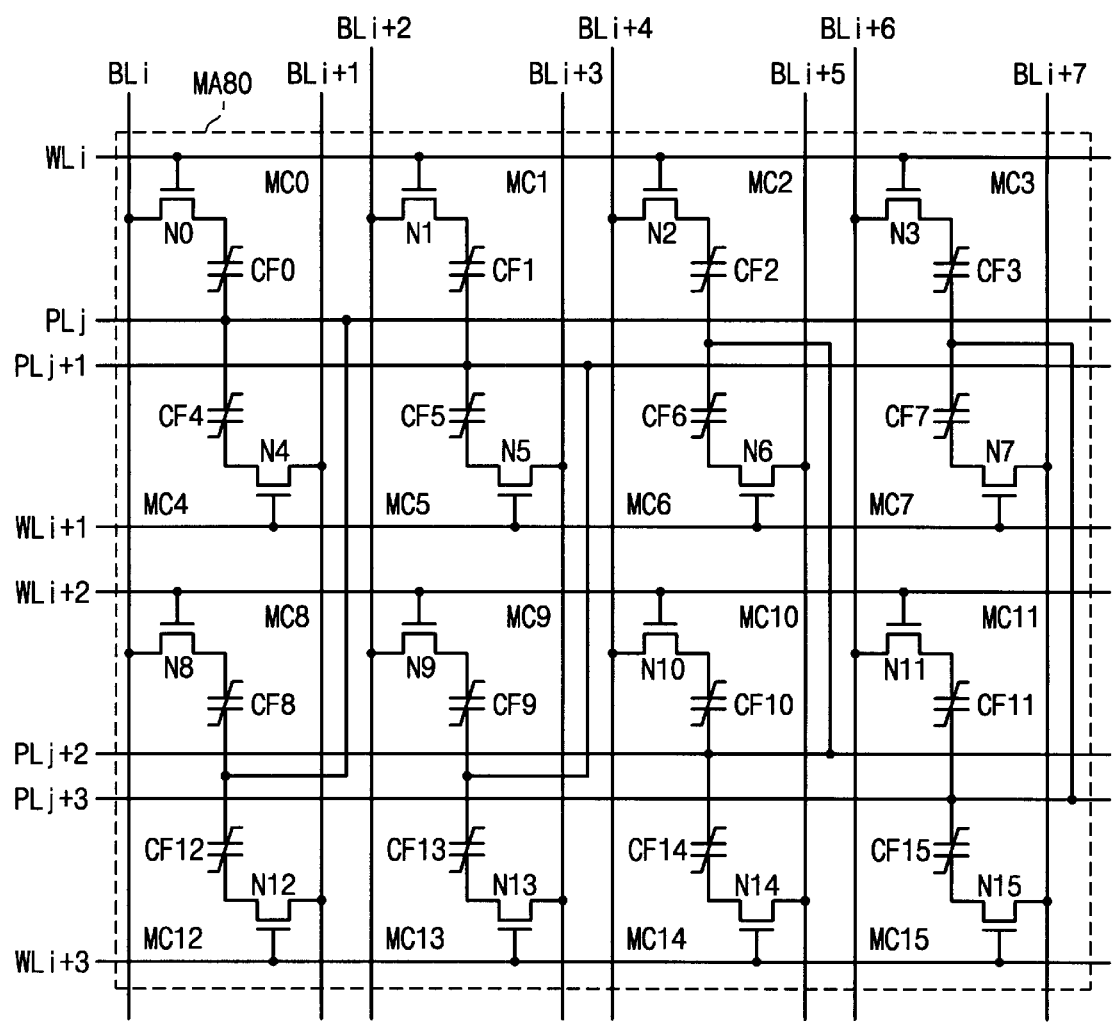
FIG. 8 is a schematic diagram of a ferroelectric memory device according to sixth embodiments of the present invention.

FIG. 8 illustrates a configuration according to other embodiments of the present invention, using a plate line arrangement similar to that of FIG. 3. An array unit MA80 includes 16 memory cells MC0–MC15.

In the memory cell MC0, a gate and a drain of an NMOS transistor N0 are respectively connected to a bit line BLi and a word line WLi, and a capacitor CF0 is connected to the plate line PLj. A drain and a gate of an NMOS transistor N1 in the memory cell MC1 are respectively connected to a bit line BLi+2 and the word line WLi, and a capacitor CF1 is connected to a plate line PLj+1. In the memory cell MC2, a drain and a gate of an NMOS transistor N2 are respectively connected to a bit line BLi+4 and the word line WLi, and a capacitor CF2 is connected to a plate line PLj+2. In the memory cell MC3, a drain and a gate of an NMOS transistor N3 are respectively connected to a bit line BLi+6 and the word line WLi, and a capacitor CF3 is connected to a plate line PLj+3. In the memory cell MC4, a drain and a gate of an NMOS transistor N4 are respectively connected to the bit line BLi+1 and a word line WLi+1, and a capacitor CF4 is connected to the plate line PLj. In the memory cell MC5, a drain and a gate of an NMOS transistor N5 are respectively connected to the bit line BLi+3 and the word line WLi+1, and a capacitor CF5 is connected to the plate line PLj+1. In the memory cell MC6, a drain and a gate of an NMOS transistor N6 are respectively connected to a bit line BLi+5 and the word line WLi+1, and a capacitor CF6 is connected to the plate line PLj+2. In the memory cell MC7, a drain and a gate of an NMOS transistor N7 are respectively connected to a bit line BLi+7 and the word line WLi+1, and a capacitor CF7 is connected to the plate line PLj+3.

In the memory cell MC8, a drain and a gate of an NMOS transistor N8 are respectively connected to the bit line BLi and the word line WLi+2, and a capacitor CF8 is connected to the plate line PLj. In the memory cell MC9, a drain and a gate of an NMOS transistor N9 are respectively connected to the bit line BLi+2 and the word line WLi+2, and a capacitor CF9 is connected to the plate line PLj+1. In the memory cell MC10, a drain and a gate of an NMOS transistor N10 are respectively connected to the bit line BLi+4 and the word line WLi+2, and a capacitor CF10 is connected to the plate line PLj+2. In the memory cell MC11, a drain and a gate of an NMOS transistor N11 are respectively connected to the bit line BLi+7 and the word line WLi+2, and a capacitor CF11 is connected to the plate line PLj+3. In the memory cell MC12, a drain and a gate of an NMOS transistor N12 are respectively connected to the bit line BLi+1 and the word line WLi+3, and a capacitor CF12 is connected to the plate line PLj. In the memory cell MC13, a drain and a gate of an NMOS transistor N13 are respectively connected to the bit line BLi+3 and the word line WLi+3, and a capacitor CF13 is connected to the plate line PLj+1. In the memory cell MC14, a drain and a gate of an NMOS transistor N14 are respectively connected to the bit line BLi+5 and the word line WLi+3, and a capacitor CF14 is connected to the plate line PLj+2. In the memory cell MC15, a drain and a gate of an NMOS transistor N15 are respectively connected to the bit line BLi+7 and the word line WLi+3, and a capacitor CF15 is connected to the plate line PLj+3.

Four capacitors are commonly connected to one plate line in one array unit MA80, similar to the configuration of FIG. 7. If, for example, the word line WLi, the plate line PLj and the bit line BLi are simultaneously activated in a read or write operation, the memory cell MC0 is selected while the other memory cells connected to the plate line PLj remain in an unselected state.

Figure 9:
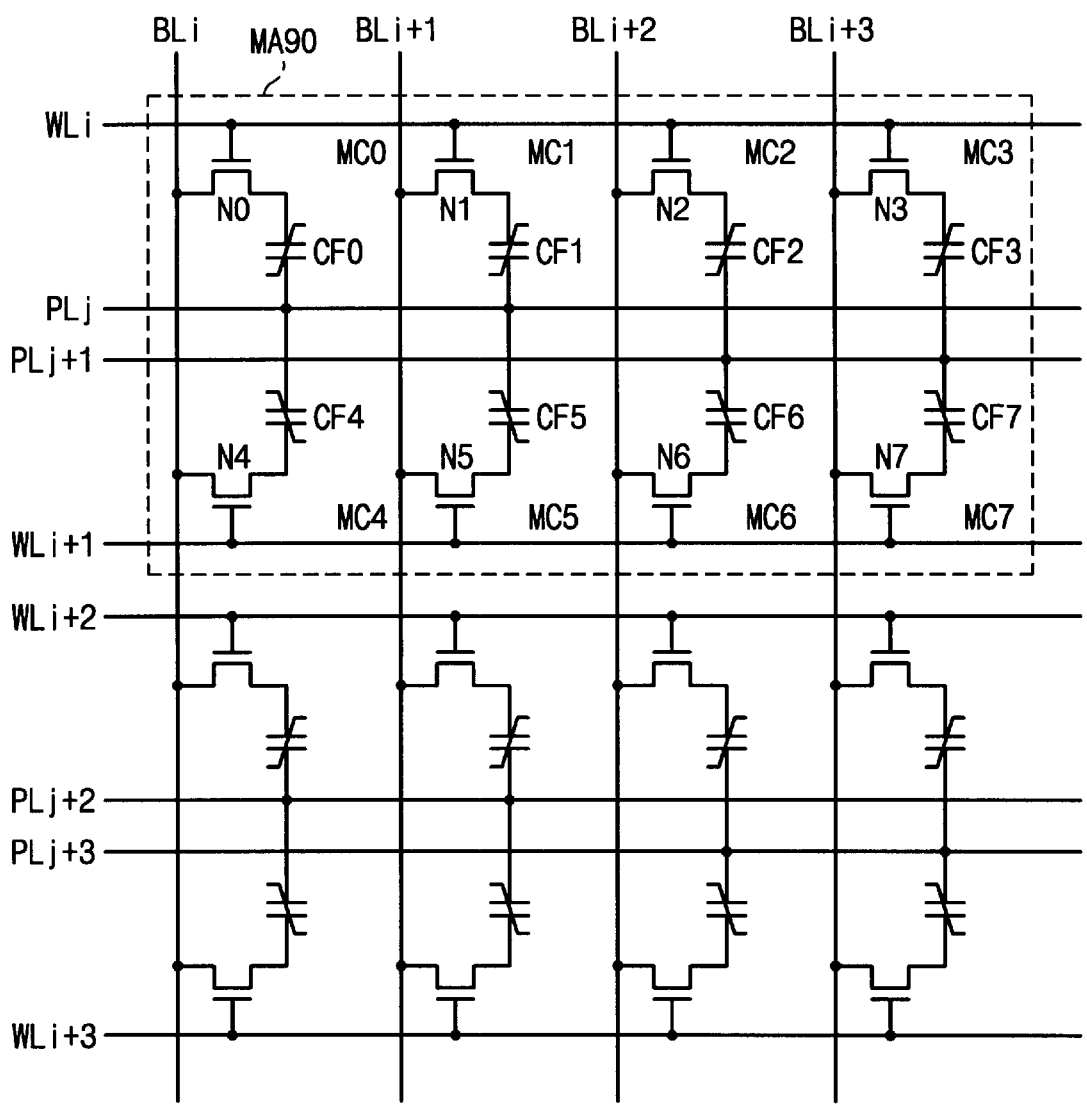
FIG. 9 is a schematic diagram of a ferroelectric memory device according to seventh embodiments of the present invention.

FIG. 9 illustrates a configuration according to other embodiments of the present invention that uses a similar plate line arrangement to that used in FIG. 3. An array unit MA90 includes 8 memory cells MC0–MC7.

In the memory cell MC0, a drain and a gate of an NMOS transistor N0 are respectively connected to a bit line BLi and a word line WLi, and a capacitor CF0 is connected to a plate line PLj. In the memory cell MC1, a drain and a gate of an NMOS transistor Ni are respectively connected to a bit line BLi+1 and the word line WLi, and a capacitor CF1 is connected to the plate line PLj. In the memory cell MC2, a drain and a gate of an NMOS transistor N2 are respectively connected to a bit line BLi+2 and the word line WLi, and a capacitor CF2 is connected to a plate line PLj+1. In the memory cell MC3, a drain and a gate of an NMOS transistor N3 are respectively connected to a bit line BLi+3 and the word line WLi, and a capacitor CF3 is connected to the plate line PLj+1. In the memory cell MC4, a drain and a gate of an NMOS transistor N4 are respectively connected to the bit line BLi and the word line WLi+1, and a capacitor CF4 is connected to the plate line PLj. In the memory cell MC5, a drain and a gate of an NMOS transistor N5 are respectively connected to the bit line BLi+1 and the word line WLi+1, and a capacitor CF5 is connected to the plate line PLj. In the memory cell MC6, a drain and a gate of an NMOS transistor N6 are respectively connected to the bit line BLi+2 and the word line WLi+1, and a capacitor CF6 is connected to the plate line PLj+1. In the memory cell MC7, a drain and a gate of an NMOS transistor N7 are respectively connected to the bit line BLi+3 and the word line WLi+1, and a capacitor CF7 is connected to the plate line PLj+1.

The configuration of FIG. 9 is similar that of FIG. 7 in that four capacitors are connected to one plate line in the array unit MA90. If, for example, the word line WLi, and the plate line PLj, and the bit line BLi are simultaneously activated in a read or write operation, the memory cell MC0 is selected while the other memory cells connected to the plate line PLj remain in an unselected state.

Figure 10:
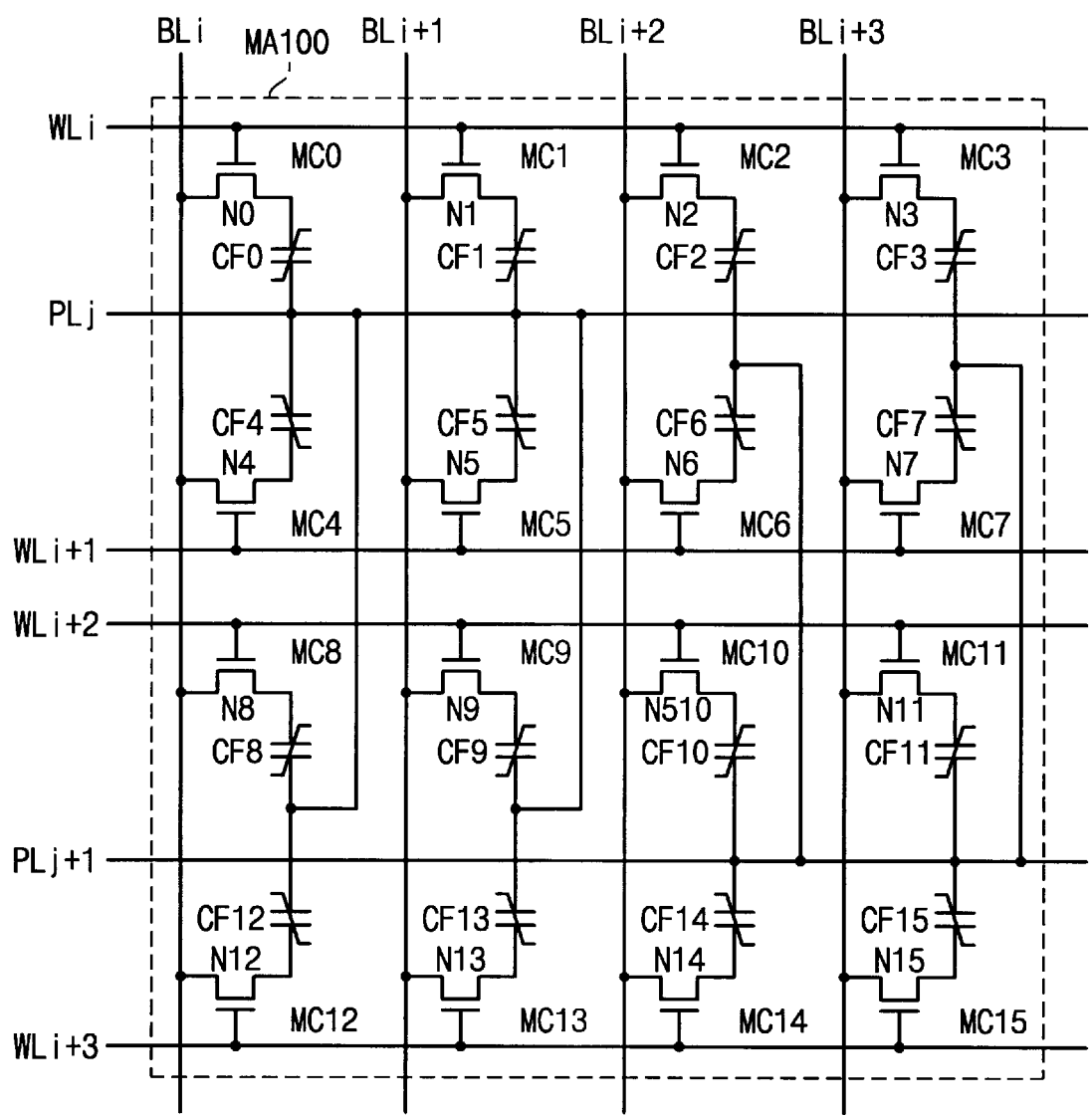
FIG. 10 is a schematic diagram of a ferroelectric memory device according to eighth embodiments of the present invention.

FIG. 10 illustrates a configuration according to further embodiments of the present invention, s a case applying an extended connecting form of the plate line with the capacitors in the shared bit line architecture to which the plate line arrangement with plate line spacing similar to that of FIG. 4. An array unit MA100 includes 16 memory cells MC0–MC15.

In the memory cell MC0, a drain and a gate of an NMOS transistor N0 are respectively connected to a bit line BLi and a word line WLi, and a capacitor CF0 is connected to a plate line PLj. A drain and a gate of an NMOS transistor N1 in the memory cell MC1 are respectively connected to a bit line BLi+1 and the word line WLi, and a capacitor CF1 is connected to a plate line PLj. In the memory cell MC2, a drain and a gate of an NMOS transistor N2 are respectively connected to a bit line BLi+2 and the word line WLi, and a capacitor CF2 is connected to a plate line PLj+1. In the memory cell MC3, a drain and a gate of an NMOS transistor N3 are respectively connected to a bit line BLi+3 and the word line WLi, and a capacitor CF3 is connected to the plate line PLj+1. In the memory cell MC4, a drain and a gate of an NMOS transistor N4 are respectively connected to the bit line BLi and a word line WLi+1, and a capacitor CF4 is connected to the plate line PLj. In the memory cell MC5, a drain and a gate of an NMOS transistor N5 are respectively connected to the bit line BLi+1 and the word line WLi+1, and a capacitor CF5 is connected to the plate line PLj. In the memory cell MC6, a drain and a gate of an NMOS transistor N6 are respectively connected to the bit line BLi+2 and the word line WLi+1, and a capacitor CF6 is connected to the plate line PLj+1. In the memory cell MC7, a drain and a gate of an NMOS transistor N7 are respectively connected to the bit line BLi+3 and the word line WLi+1, and a capacitor CF7 is connected to the plate line PLj+1.

In the memory cell MC8, a drain and a gate of an NMOS transistor N8 are respectively connected to the bit line BLi and a word line WLi+2, and a capacitor CF8 is connected to the plate line PLj. In the memory cell MC9, a drain and a gate of an NMOS transistor N9 are respectively connected to the bit line BLi+1 and the word line WLi+2, and a capacitor CF9 is connected to the plate line PLj. In the memory cell MC10, a drain and a gate of an NMOS transistor N10 are respectively connected to the bit line BLi+2 and the word line WLi+2, and a capacitor CF10 is connected to the plate line PLj+1. In the memory cell MC11, a drain and a gate of an NMOS transistor N11 are respectively connected to the bit line BLi+3 and the word line WLi+2, and a capacitor CF11 is connected to the plate line PLj+1. In the memory cell MC12, a drain and a gate of an NMOS transistor N12 are respectively connected to the bit line BLi and the word line WLi+3, and a capacitor CF12 is connected to the plate line PLj. In the memory cell MC13, a drain and a gate of an NMOS transistor N13 are respectively connected to the bit line BLi+1 and the word line WLi+3, and a capacitor CF13 is connected to the plate line PLj. In the memory cell MC 14, a drain and a gate of the NMOS transistor N14 are respectively connected to the bit line BLi+2 and the word line WLi+3, and a capacitor CF14 is connected to the plate line PLj+1. In the memory cell MC15, a drain and a gate of an NMOS transistor N15 are respectively connected to the bit line BLi+3 and the word line WLi+3, and a capacitor CF15 is connected to the plate line PLj+1.

It will be appreciated that, although the above-described embodiments show the use of 1TC memory cells, the present application is applicable to the 2TC memory cell configurations. The present invention can provide memory cell configurations, which may be highly integrated by reducing the number of circuits for selecting and activating plate lines and by increasing the number of the capacitors connected to one plate line. Further, the number of required sense amplifiers can be reduced, which may result in reduced power consumption.

In the drawings and specification, there have been disclosed typical embodiments of the invention and, although specific terms are employed, they are used in a generic and descriptive sense only and not for purposes of limitation, the scope of the invention being set forth in the following claims. Although the invention has been described with reference to particular embodiments, it will be apparent to one of ordinary skill in the art that modifications of the described embodiments may be made without departing from the spirit and scope of the invention.

What is claimed is:

1. A ferroelectric memory device, comprising:
  a plurality of parallel word lines extending along a first direction;
  a plurality of parallel bit lines extending along a second direction transverse to the first direction;
  a plurality of parallel plate lines extending along the first direction; and
  a plurality of memory cells arranged in rows and columns along the respective first and second directions, each of the memory cells including a transistor coupled to one of the word lines and to one of the bit lines and a ferroelectric capacitor connected to the transistor and to one of the plate lines such that the cells in respective rows are connected to respective word lines and the ferroelectric capacitors of first and second subsets of a row of memory cells are connected to respective first and second plate lines.

2. A memory device according to claim 1, wherein the plate lines are arranged as a plurality of pairs of adjacent plate lines such that a first pair of adjacent plate lines is separated from a second pair of adjacent plate lines by a pair of rows of memory cells.

3. A memory device according to claim 2, wherein the memory cells in a row of memory cells adjacent the first pair of adjacent plate lines are connected to alternating ones of the first and second plate lines along the first direction.

4. A memory device according to claim 3, wherein the respective columns of memory cells are connected to respective bit lines.

5. A memory device according to claim 3, wherein memory cells in a column of memory cells are alternately connected to first and second bit lines along the second direction.

6. A memory device according to claim 2, wherein the first and second pairs of adjacent plate lines are connected to memory cells in both rows of the pair of rows of memory cells that separate the first and second pairs of adjacent plate lines.

7. A memory device according to claim 6, wherein the respective columns of memory cells are connected to respective bit lines.

8. A memory device according to claim 6, wherein memory cells in a column of memory cells are alternately connected to first and second bit lines along the second direction.

9. A memory device according to claim 2, wherein the first pair of adjacent bit lines are connected only to memory cells in first and second rows of memory cells disposed on opposite sides of the first pair of bit lines.

10. A memory device according to claim 1, wherein the plate lines are separated from one another by pairs of adjacent rows of memory cells.

11. A memory device according to claim 10, wherein each plate line is connected only to memory cells in every other column along the first direction.

12. A memory device according to claim 11, wherein the respective columns of memory cells are connected to respective bit lines.

13. A memory device according to claim 11, wherein memory cells in a column of memory cells are alternately connected to first and second bit lines along the second direction.

14. A memory device according to claim 10, each plate line is connected only to memory cells in every other pair of adjacent columns along the first direction.

15. A ferroelectric memory device, comprising:
  an array unit connected to a plurality of word lines and a plurality of bit lines arranged along respective row and column directions and to a plurality of plate lines extending along the row direction and including a plurality of memory cells, wherein n memory cells of a row of m memory cells of the array unit are connected to a plate line, wherein m is greater than n.

16. The device of claim 15, wherein a plate line is commonly connected to adjacent memory cells in the column direction.

17. A ferroelectric memory device, comprising:
a memory cell array including like array units arranged in rows and columns, wherein each of the array units comprises:
  a first memory cell connected to a first word line, a first bit line and a first plate line;
  a second memory cell connected to the first word line, a second bit line and a second plate line;
  a third memory cell connected to a second word line, the first bit line and the first plate line; and
  a fourth memory cell connected to the second word line, the second bit line and the second plate line.

18. A ferroelectric memory device, comprising:
a memory cell array including repeating array units arranged in rows and columns, wherein each of the array units comprises:
  a first memory cell connected to a first word line, a first bit line, and a first plate line;
  a second memory cell connected to the first word line, a second bit line, and a second plate line;
  a third memory cell connected to a second word line, the first bit line, and the first plate line;
  a fourth memory cell connected to the second word line, the second bit line, and the second plate line;
  a fifth memory cell connected to a third word line, the first bit line, and the first plate line;
  a sixth memory cell connected to the third word line, the second bit line, and the second plate line;
  a seventh memory cell connected to a fourth word line, the first bit line, and the first plate line; and
  an eighth memory cell connected to the fourth word line, the second bit line, and the second plate line.

19. A ferroelectric memory device, comprising:
a memory cell array including like array units arranged in rows and columns, wherein each of the array units comprises:
  a first memory cell connected to a first word line, a first bit line, and a first plate line;
  a second memory cell connected to the first word line, a third bit line, and a second plate line;
  a third memory cell connected to a second word line, a second bit line, and the first plate line; and
  a fourth memory cell connected to the second word line, the fourth bit line, and the second plate line, wherein the first and second plate lines are extended to row direction in adjacent array unit in column direction with the array unit.

20. A ferroelectric memory device, comprising:
a memory cell array including a plurality of array units arranged in rows and columns, wherein each of the array units comprises:
  a first memory cell connected to a first word line, a first bit line, and a first plate line;
  a second memory cell connected to the first word line, a third bit line, and a second plate line;
  a third memory cell connected to a second word line, the first bit line, and the first plate line;
  a fourth memory cell connected to the second word line, a fourth bit line, and the second plate line;
  a fifth memory cell connected to a third word line, the first bit line, and the first plate line;
  a sixth memory cell connected to the third word line, the third bit line, and the second plate line;
  a seventh memory cell connected to a fourth word line, the first bit line, and the first plate line; and
  an eighth memory cell connected to the fourth word line, the fourth bit line, and the second plate line.

21. A ferroelectric memory device, comprising:
a memory cell array including a plurality of array units arranged in rows and columns, wherein each of the array units comprises:
  a first memory cell connected to a first word line, a first bit line, and a first plate line;
  a second memory cell connected to the first word line, a second bit line, and a second plate line;
  a third memory cell connected to the first word line, a third bit line, and a third plate line;
  a fourth memory cell connected to the first word line, the fourth bit line, and a fourth plate line;
  a fifth memory cell connected to a second word line, the first bit line, and the first plate line;
  a sixth memory cell connected to the second word line, the second bit line, and the second plate line;
  a seventh memory cell connected to the second word line, the third bit line, and the third plate line;
  an eighth memory cell connected to the second word line, the fourth bit line, and the fourth plate line;
  a ninth memory cell connected to a third word line, the first bit line, and the first plate line;
  a tenth memory cell connected to the third word line, the second bit line, and the second plate line;
  an eleventh memory cell connected to the third word line, the third bit line, and the third plate line;
  a twelfth memory cell connected to the third word line, the fourth bit line, and the fourth plate line;
  a thirteenth memory cell connected to a fourth word line, the first bit line, and the first plate line;
  a fourteenth memory cell connected to the fourth word line, the second bit line, and the second plate line;
  a fifteenth memory cell connected to the fourth word line, the third bit line, and the third plate line; and
  a sixteenth memory cell connected to the fourth word line, the fourth bit line, and the fourth plate line.

22. A ferroelectric memory device, comprising:
a memory cell array including a plurality of array units arranged in rows and columns, wherein each of the array units comprises:
  a first memory cell connected to a first word line, a first bit line, and a first plate line;
  a second memory cell connected to the first word line, a third bit line, and a second plate line;
  a third memory cell connected to the first word line, a fifth bit line, and a third plate line;
  a fourth memory cell connected to the first word line, a seventh bit line, and a fourth plate line;
  a fifth memory cell connected to a second word line, a second bit line, and the first plate line;
  a sixth memory cell connected to the second word line, a fourth bit line, and the second plate line;
  a seventh memory cell connected to the second word line, a sixth bit line, and the third plate line;
  an eighth memory cell connected to the second word line, an eighth bit line, and the fourth plate line;
  a ninth memory cell connected to a third word line, the first bit line, and the first plate line;
  a tenth memory cell connected to the third word line, the third bit line, and the second plate line;
  an eleventh memory cell connected to the third word line, the fifth bit line, and the third plate line;
  a twelfth memory cell connected to the third word line, the seventh bit line, and the fourth plate line;
  a thirteenth memory cell connected to a fourth word line, the second bit line, and the first plate line;
  a fourteenth memory cell connected to the fourth word line, the forth bit line, and the second plate line;

a fifteenth memory cell connected to the fourth word line, the sixth bit line, and the third plate line; and a sixteenth memory cell connected to the fourth word line, the eighth bit line, and the fourth plate line.

23. A ferroelectric memory device, comprising:

a memory cell array including a plurality of array units arranged in rows and columns, wherein each of the array units comprises:

a first memory cell connected to a first word line, a first bit line, and a first plate line;

a second memory cell connected to the first word line, a second bit line, and the first plate line;

a third memory cell connected to the first word line, a third bit line, and a second plate line;

a fourth memory cell connected to the first word line, a fourth bit line, and the second plate line;

a fifth memory cell connected to a second word line, the first bit line, and the first plate line;

a sixth memory cell connected to the second word line, the second bit line, and the first plate line;

a seventh memory cell connected to the second word line, the third bit line, and the second plate line; and an eighth memory cell connected to the second word line, the fourth bit line, and the second plate line.

24. A ferroelectric memory device, comprising:

a memory cell array including a plurality of array units arranged in rows and columns, wherein each of the array units comprises:

a first memory cell connected to a first word line, a first bit line, and a first plate line;

a second memory cell connected to the first word line, a second bit line, and a first plate line;

a third memory cell connected to the first word line, a third bit line, and a second plate line;

a fourth memory cell connected to the first word line, a fourth bit line, and the second plate line;

a fifth memory cell connected to the second word line, the first bit line, and the first plate line;

a sixth memory cell connected to the second word line, the second bit line, and the first plate line;

a seventh memory cell connected to the second word line, the third bit line, and the second plate line;

an eighth memory cell connected to the second word line, the fourth bit line, and the second plate line;

a ninth memory cell connected to a third word line, the first bit line, and the first plate line;

a tenth memory cell connected to the third word line, the second bit line, and the first plate line;

an eleventh memory cell connected to the third word line, the third bit line, and the second plate line;

a twelfth memory cell connected to the third word line, the fourth bit line, and the second plate line;

a thirteenth memory cell connected to a fourth word line, the first bit line, and the first plate line;

a fourteenth memory cell connected to the fourth word line, the second bit line, and the first plate line;

a fifteenth memory cell connected to the fourth word line, the third bit line, and the second plate line; and a sixteenth memory cell connected to the fourth word line, the fourth bit line, and the second plate line.

* * * * *